(12) United States Patent  
Imai

(10) Patent No.: US 7,157,322 B2  
(45) Date of Patent: Jan. 2, 2007

(54) SEMICONDUCTOR DEVICE AND METHOD FOR MANUFACTURING SAME

(75) Inventor: Kiyotaka Imai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 273 days.

(21) Appl. No.: 09/828,862

(22) Filed: Apr. 10, 2001

(65) Prior Publication Data

US 2002/0042177 A1 Apr. 11, 2002

(51) Int. Cl.
*H01L 21/336* (2006.01)
*H01L 21/8234* (2006.01)
*H01L 21/8238* (2006.01)

(52) U.S. Cl. .................. 438/197; 438/199; 438/223

(58) Field of Classification Search ........ 257/335–344, 257/368–369, 370–371, 408; 438/197–228, 438/309

See application file for complete search history.

(56) References Cited

U.S. PATENT DOCUMENTS

| 5,024,960 | A |   | 6/1991  | Haken |  |
|---|---|---|---|---|---|
| 5,276,346 | A | * | 1/1994  | Iwai et al. | 257/368 |
| 5,291,052 | A | * | 3/1994  | Kim et al. | 257/369 |
| 5,440,165 | A | * | 8/1995  | Mitsunaga et al. | 257/408 |
| 5,512,771 | A | * | 4/1996  | Hiroki et al. | 257/369 |
| 5,677,217 | A |   | 10/1997 | Tseng |  |
| 5,747,855 | A | * | 5/1998  | Dennison et al. | 257/369 |
| 5,757,083 | A | * | 5/1998  | Yang | 257/903 |
| 5,851,866 | A | * | 12/1998 | Son | 438/231 |
| 5,880,500 | A | * | 3/1999  | Iwata et al. | 257/336 |
| 6,649,308 | B1 | * | 11/2003 | Wu | 430/5 |

FOREIGN PATENT DOCUMENTS

| JP | 61-216364   |   | 6/1986  |
| JP | 62-229976   |   | 10/1987 |
| JP | 2-239632    |   | 9/1990  |
| JP | JP02-239632 | * | 9/1990  |
| JP | 8-148679    |   | 6/1996  |
| TW | 347591      |   | 12/1998 |
| TW | 349248      |   | 1/1999  |

* cited by examiner

*Primary Examiner*—Cuong Nguyen  
(74) *Attorney, Agent, or Firm*—McGinn Intellectual Property Law Group, PLLC

(57) ABSTRACT

A semiconductor device including an NMOSFET which has an n-type source/drain main region containing arsenic and an n-type source/drain buffer region having arsenic and phosphorous of which a concentration is lower than that of the source/drain main region, and the concentration of the phosphorous in the source/drain buffer region is smaller than the concentration of the arsenic therein. The semiconductor device has a suppressed reverse short channel effect and reduced p-n junction leakage current. Further, the semiconductor device has a larger margin to a certain gate length and a specified threshold voltage to elevate a production yield.

23 Claims, 11 Drawing Sheets

SEMICONDUCTOR DEVICE AND METHOD FOR MANUFACTURING SAME

BACKGROUND OF THE INVENTION (a) Field of the Invention

The present invention relates to a semiconductor device including an NMOSFET and a method for manufacturing the same, more in detail, to the semiconductor device including the NMOSFET having an accurate threshold voltage at a designed value due to excellent controllability of the threshold voltage, and reduced p-n junction leakage current, and the method for manufacturing the same.

(b) Description of the Related Art

A high performance LSI has been realized which includes a CMOSFET including an n-channel MOSFET and a p-channel MOSFET. Reduction of the length of the channels of the MOSFET and the resulting shallower junction of the source/drain region are progressing.

In order to form a shallower source/drain junction in an n-channel MOS transistor, ions having a smaller thermal diffusion coefficient during heat treatment and activation thereof are used as n-type impurities for ion-implantation.

Heretofore, arsenic (As) having a smaller thermal diffusion coefficient compared to phosphorous (P) is ion-implanted and the wafer is heat-treated to form the boundary of the source/drain diffusion regions located at a designed shallower position.

Referring now to FIGS. 1A and 1B, a conventional method of forming a source/drain region of an NMOSFET by means of ion-implantation of arsenic will be described.

At first, element isolation regions 64 are formed in a p-type silicon substrate 62. Then, a p-well 66 is formed in a field region isolated by the element isolation regions 64, and a p-channel region 68 for controlling a threshold voltage is formed by boron (B) implantation. A gate oxide layer 70 is formed on the p-channel region 68, and a gate electrode 72 made by polysilicon is formed thereon. Then, n-type extension regions 74 are formed along the p-channel region 68, and side walls 76 made of insulator is formed along the gate electrode 72.

In accordance with these procedures, a semiconductor device shown in FIG. 1A can be obtained.

Then, arsenic ions as n-type impurities are implanted at an acceleration energy of 50 keV and a dosage of $5 \times 10^{15}/cm^2$. The wafer is then heat-treated for activation, to form n-type source/drain regions 78 thereby providing the semiconductor device shown in FIG. 1B.

In the conventional method for forming the source/drain region of the NMOSFET, a reverse short channel effect of the NMOSFET is noticeable which lowers the controllability of the threshold voltage. The reverse short channel effect is a phenomenon in which the threshold voltage largely changes depending on the length of the gate wherein the threshold voltage increases with reduction of the gate length and the reduction of the gate length below a specified value rapidly lowers the threshold voltage as shown in FIG. 2.

FIG. 2 is a graph showing relations between gate lengths (μm) plotted on abscissa and threshold voltages (V) plotted on ordinate by using an ion species, an acceleration energy and an ion dosage as parameters. Lines (1), (2) and (3) in the graph indicate the relations between the gate length and the threshold voltage when the arsenic ions are implanted at the acceleration energies of 50 keV, 30 keV and 10 keV, respectively, and at the fixed dosage of $5 \times 10^{15}/cm^2$.

The reverse short channel effect largely changes the threshold voltage even by the slight change of the gate length during manufacture of the NMOSFET. When, for example, the gate length is only slightly shortened in the step for forming the gate electrode whereby the control of the threshold voltage of the MOSFET is hardly performed, the threshold voltage is significantly increased. The inability of manufacturing the NMOSFET having the specified threshold voltage is a bar to elevating a production yield of semiconductor devices.

SUMMARY OF THE INVENTION

In view of the foregoing, an object of the present invention is to provide a semiconductor device having a configuration which allows an accurate control of the threshold voltage by suppressing a reverse short channel effect of an NMOSFET.

The present invention provides, in a first aspect thereof, semiconductor device including a silicon substrate and an NMOSFET formed on the silicon substrate, the NMOSFET including n-type source/drain main regions containing arsenic as n-type impurities, and n-type source/drain buffer regions located below the source/drain main regions and in contact therewith, the source/drain buffer regions having arsenic and phosphorous as n-type impurities at a concentration lower than an impurity concentration in the source/drain main regions, the concentration of the phosphorous in the source/drain buffer regions being smaller than a concentration of the arsenic therein.

In accordance with the first aspect of the present invention, the semiconductor device including the NMOSFET having a suppressed reverse short channel effect and reduced p-n junction leakage current can be realized.

The present invention provides, in a second aspect thereof, a method for manufacturing a semiconductor device. The method includes the steps of: implanting arsenic ions in a semiconductor substrate at a first acceleration energy level which suppresses a reverse channel effect to form arsenic ion implanted regions; implanting phosphorous ions in the arsenic ion implanted regions, following the arsenic ion implanting step, at a second acceleration energy level lower than the first acceleration energy level, so as to form a concentration peak of the phosphorous ions located in the arsenic ion implanted regions; heat-treating the ion implanted regions for activation of the arsenic ions and the phosphorous ions to form source/drain regions; and forming an NMOSFET having the source/drain The first acceleration energy of the arsenic ion may be not higher than 15 keV, and the second acceleration energy of the phosphorous ion may be not higher than 10 keV.

In accordance with the second aspect of the present invention, since the source/drain region having the shallower junction and the buffer regions are formed in the NMOSFET region by the two successive ion implantations, the present invention achieves a simple process for fabricating a semiconductor device including an NMOSFET having a suppressed reverse short channel effect and reduced p-n junction leakage current.

The above and other objects, features and advantages of the present invention will be more apparent from the following description.

PREFERRED EMBODIMENTS OF THE INVENTION

Before describing preferred embodiments of the present invention, the principle of the present invention is described for a better understanding.

The present inventor has examined a reason of occurrence of the reverse short channel effect to find out the following.

Figure 3:
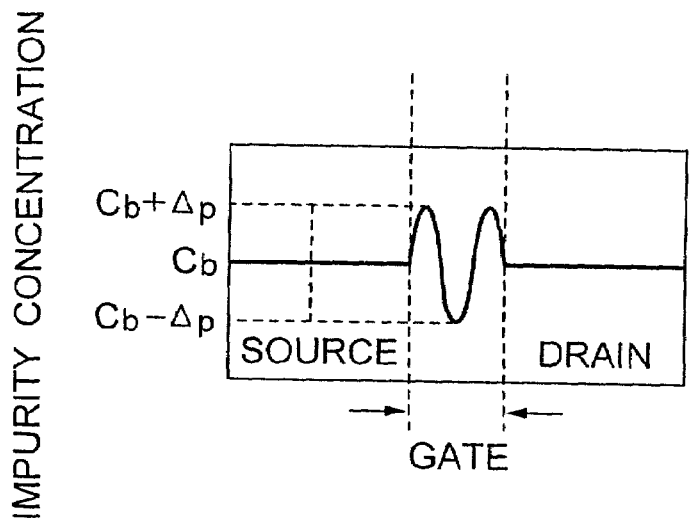
FIG. 3 is a schematic diagram showing distribution of an impurity concentration in a channel region.

Point defects are generated in the periphery of an arsenic implanted region at a time of implanting the arsenic ions. As a result, when the arsenic ions are heat-treated for activation, p-type impurities, boron (B), already implanted for forming a channel region causes a transient enhancement diffusion (TED) towards the circumferences of the channel regions due to the above point defects. Accordingly, impurity concentrations are distributed as shown in FIG. 3 so that the concentrations at the both ends of the channel region are high and that at the central part is low.

Therefore, the low threshold voltage at the central part having the low impurity concentration and the high threshold voltage at the both ends having the high impurity concentration generate the conspicuous reverse short channel effect in which the threshold voltage becomes noticeably unstable due to the change of the gate length.

Figure 1A:
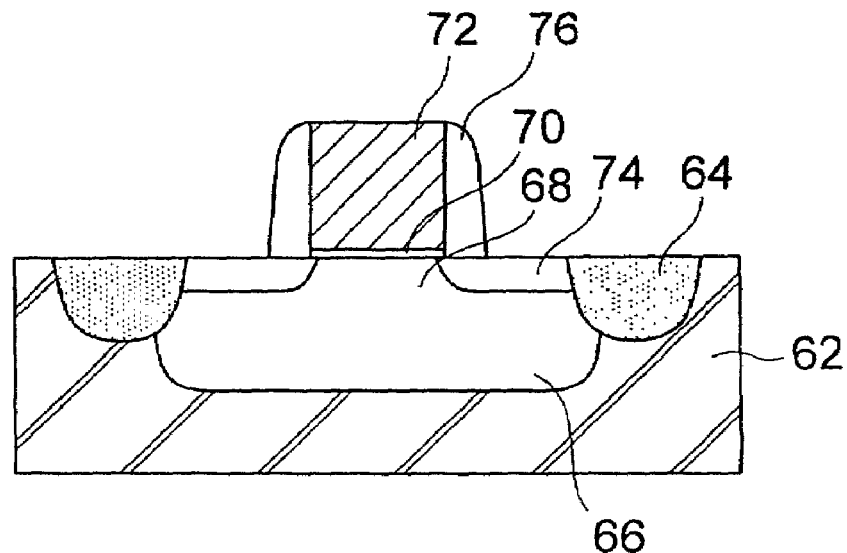
FIGS. 1A and 1B are vertical sectional views showing successive steps for conventionally manufacturing a semiconductor device.
Figure 1B:
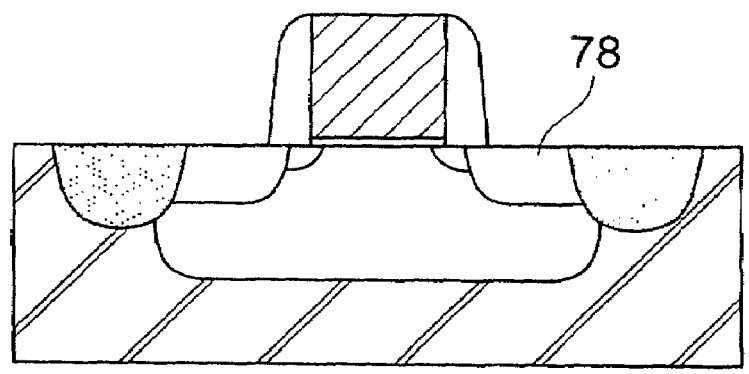
Figure 2:
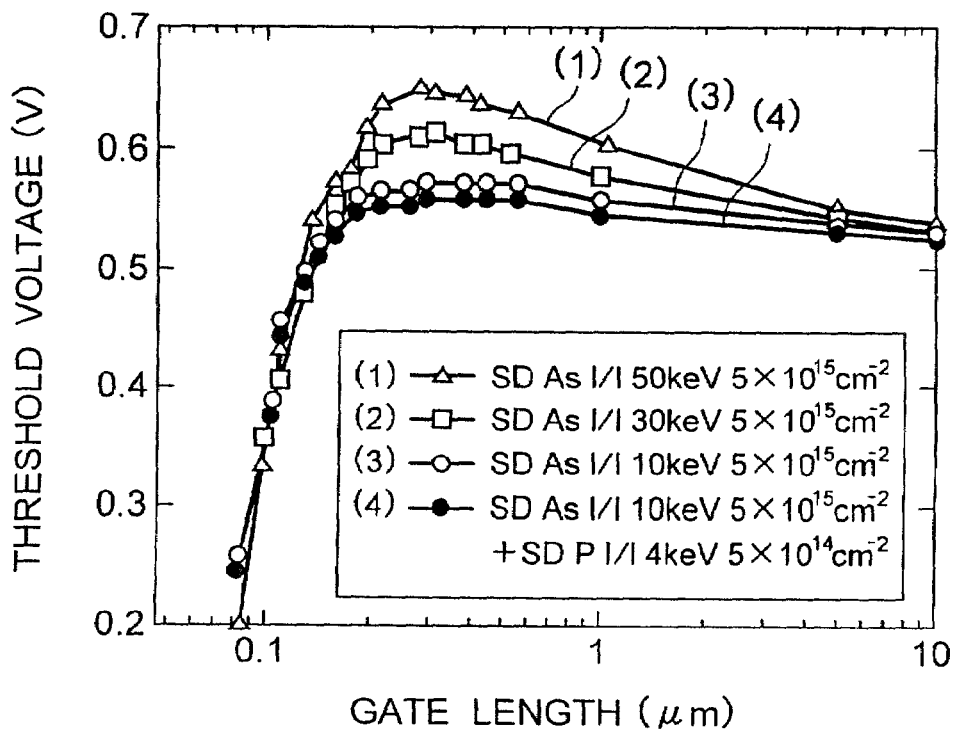
FIG. 2 is a graph showing relations between gate lengths and threshold voltages of a conventional semiconductor device and a semiconductor device in accordance with an embodiment of the present invention.

Judging from the lines (1), (2) and (3) in the graph of FIG. 2, the reverse short channel effect becomes conspicuous with the increase of the acceleration energy used for implanting the arsenic ions for forming the source/drain region.

As described earlier, the relations shown by the lines (1), (2) and (3) are obtained by the arsenic ion implantation at the implantation energies of 50 keV, 30 keV and 10 keV, respectively.

In order to reduce the reverse short channel effect, the reduction of the arsenic ion acceleration energy from 50 keV to 20 keV may be considered.

Figure 4:
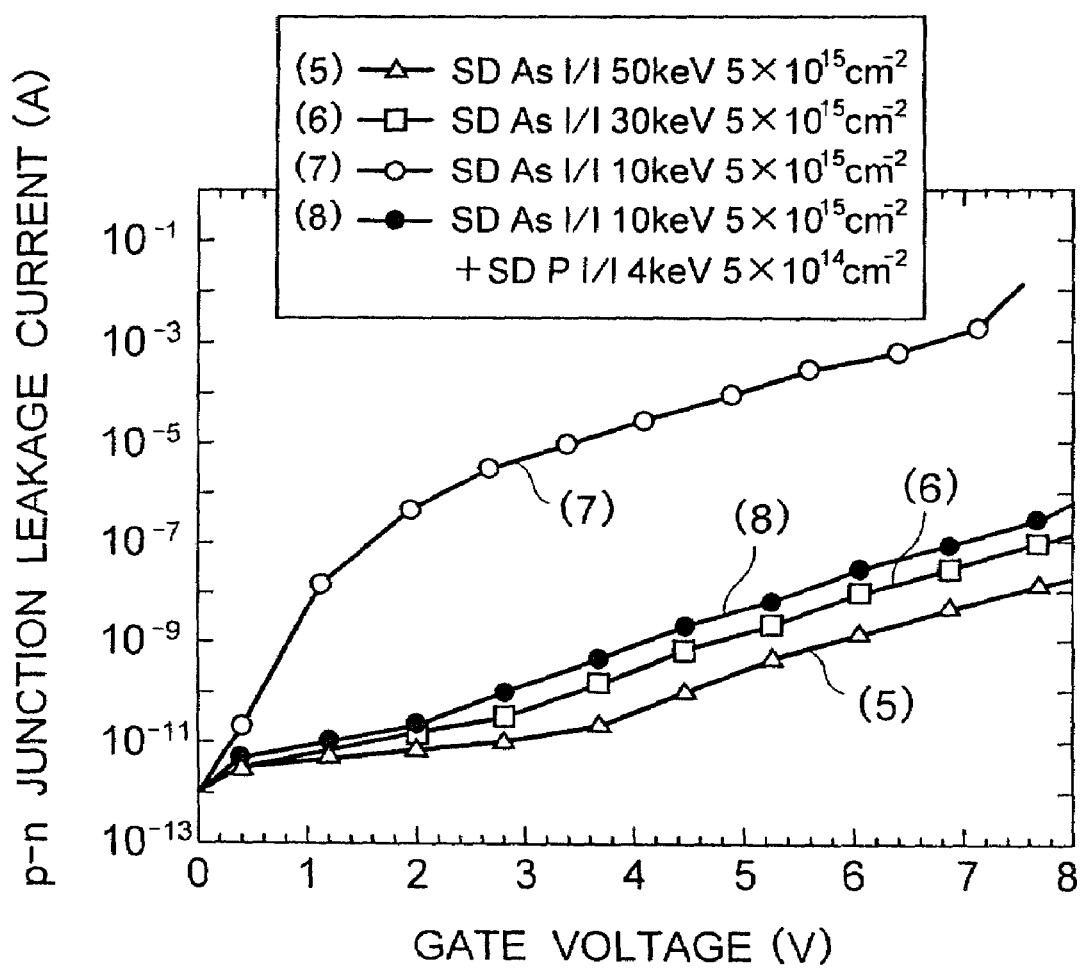
FIG. 4 is a graph showing relations between gate voltages and p-n junction leakage currents.

Although, however, the reduction of the acceleration energy to 10 keV can decrease the reverse short channel effect as shown by the line (3) of FIG. 2, another problem arises that p-n junction leakage current largely increases compared with that when the acceleration energy is 50 keV as shown by lines (7) and (5) in a graph of FIG. 4.

The lines (5), (6) and (7) in the graph of FIG. 4 show relations between gate voltages (V) and p-n junction leakage currents (A) when the implantation energies are at 50 keV, 30 keV and 10 keV, respectively.

The increase of the p-n junction leakage current can be explained as follows.

Figure 5:
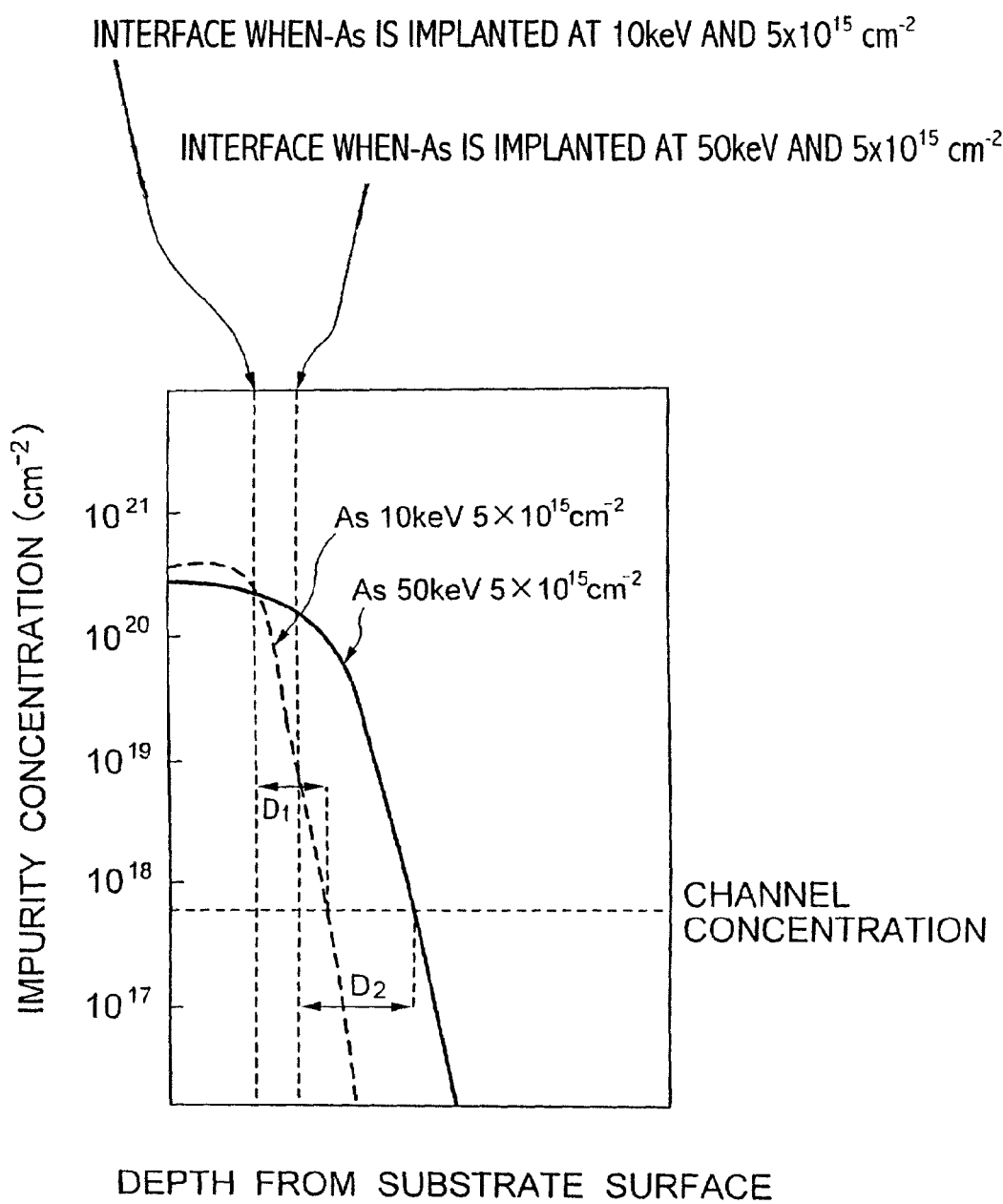
FIG. 5 is a graph showing relations between depths from a substrate surface and impurity concentrations at the respective depths when arsenic ions are implanted at 10 keV and 50 keV.

FIG. 5 is a graph showing relations between depths from a substrate surface and impurity concentrations when ion implantations are conducted at arsenic ion implantation energies of 50 keV and 10 keV and a fixed dosage of $5 \times 10^{15}/cm^2$ followed by heat-treatment.

As shown therein, the p-n junction leakage current at the arsenic acceleration energy of 10 keV increases because a distance $D_1$ between two interfaces is short. One of the interfaces is between an amorphous silicon region formed by the arsenic ion implantation and a silicon monocrystalline region, and the other interface is a p-n junction interface between the source/drain region and the channel region. The "amorphous silicon region" used herein means an area of an amorphous silicon layer formed by the arsenic ion implantation, and the "silicon monocrystalline region" means an area remaining as a single crystal silicon not implanted by the arsenic ions.

Since, on the other hand, a distance $D_2$ between the interface of the amorphous silicon region and the silicon monocrystalline region, and the p-n junction interface at the arsenic ion acceleration energy of 50 keV is longer than the distance $D_1$, the p-n junction leakage current is smaller than that at the arsenic ion acceleration energy of 10 keV.

Figure 6:
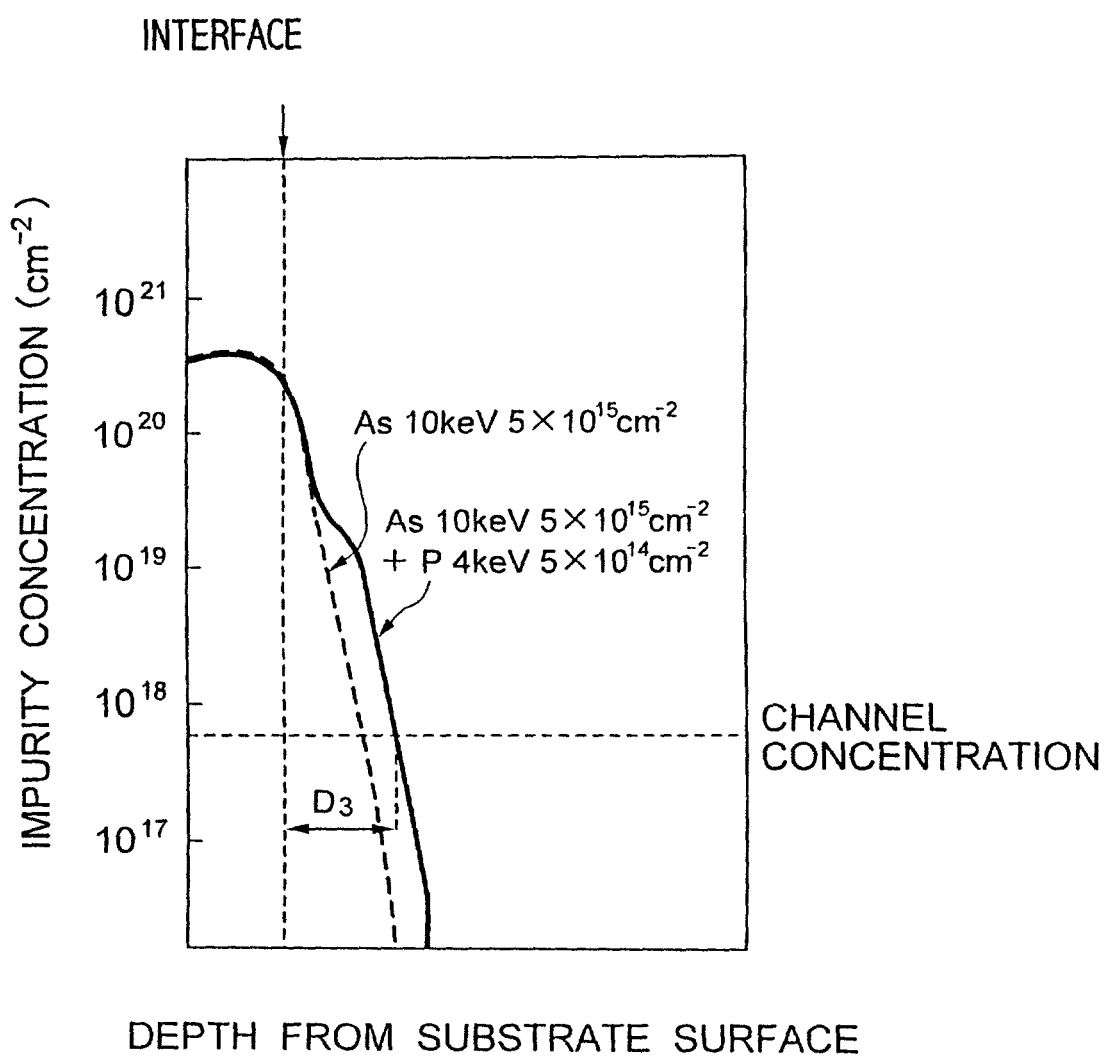
FIG. 6 is a graph showing relations between depths from a substrate surface and impurity concentrations at the respective depths when an arsenic ion is implanted at 10 keV and a phosphorous ion is subsequently implanted at 4 keV.
Figure 7:
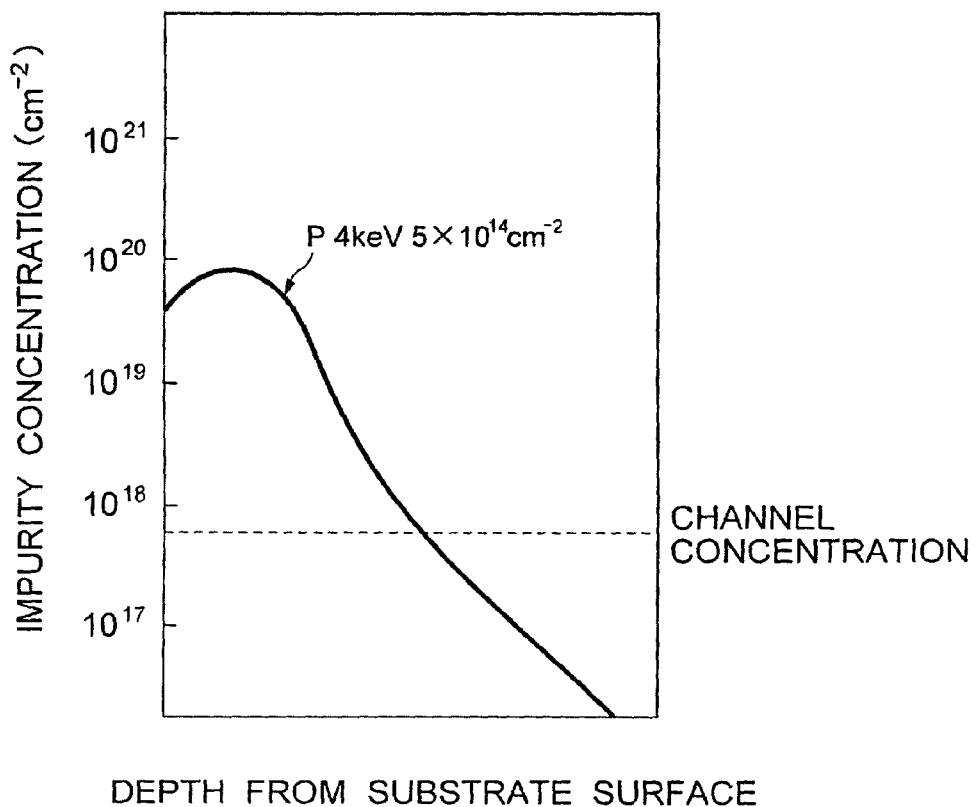
FIG. 7 is a graph showing a relation between a depth from a substrate surface and an impurity concentration at the depth when a phosphorous ion is implanted at 4 keV.

In the meantime, when phosphorous (P) ions are implanted, the profile of the phosphorous ion diffused region after heat-treatment diffuses deeper than the arsenic ion as shown in FIG. 7 when compared with FIG. 6. This is because point defects generated by the phosphorous ion implantation accelerate the diffusion of phosphorous ions.

After various experiments, the inventor has found that implantation of phosphorous ions after arsenic ions can form a profile of p-type impurity diffused region shallower than that obtained by the implantation of only the phosphorous ions.

This is because the point defects generated by the phosphorous ion implantation are absorbed by the amorphous silicon layer generated by the arsenic ion implantation and the diffusion of the phosphorous ion assisted by the point defects is weakened.

The diffusion of the phosphorous ion is found to be suppressed by forming a region having a phosphorous ion implantation concentration peak in the amorphous silicon layer formed by the arsenic ion implantation.

Accordingly, a shallower junction of a source/drain region can be formed as desired by deeper diffusion of the phosphorous ion without a phenomenon which deteriorates the gate length dependency of the threshold voltage. Since the p-n junction can be separated from the amorphous silicon region formed by the arsenic ion implantation, the junction leakage current can be reduced.

Based on the above discussions, the present inventor has researched a method for suppressing the reverse short channel effect of the NMOSFET and has conducted the following experiments.

At first, an arsenic ion was implanted under conditions of a smaller acceleration energy of 10 keV and a dosage of $5 \times 10^{15}/cm^2$ because the smaller acceleration energy reduces the reverse short channel effect. After the distance between the interface of the amorphous silicon region and the silicon monocrystalline region, and the p-n junction interface was secured, a phosphorous ion was implanted at an acceleration energy of 4 keV and a dosage of $5\times10^{14}/cm^2$ to reduce p-n junction leakage current.

Thereby, an n-type source/drain main region having a shallower junction and an n-type source/drain buffer region in contact with the bottom surface of the source/drain main region could be formed. The source/drain buffer region contained arsenic and phosphorous as n-type impurities and the phosphorous concentration was lower than the arsenic concentration.

In accordance with the wafer having the above configuration, suppression of the reverse short channel effect was confirmed after measurement thereof. As shown by the line (4) in the graph of FIG. 2, the threshold voltage was nearly constant in a range of the gate length between 0.2 and 10 μm.

As shown by the line (8) in the graph of FIG. 4, the p-n junction current was confirmed to be nearly as small as those obtained at the implantation energies of 50 keV and 30 keV [lines (5) and (6) of FIG. 4].

FIG. 6 is a graph similar to that of FIG. 5 showing a relation between a junction depth and an impurity concentration in which a solid line indicates the relation when an arsenic ion was implanted and a phosphorous ion was subsequently implanted, and a broken line indicates the relation when only an arsenic ion was implanted.

As shown in the graph of FIG. 6, a distance $D_3$ between the interface of the amorphous silicon region and the silicon monocrystalline region, and the p-n junction interface between the source/drain region and the channel region was nearly the same as the distance $D_2$ shown in FIG. 5 when the acceleration energy was 50 keV. Accordingly, the reduction of the p-n junction leakage current was confirmed because of the reduction of the energy level.

The following was confirmed after experiments under conditions of various implantation energies and dosages. The two stage ion implantations including a first arsenic implantation at a lower energy level for suppressing the reverse short channel effect, for example, at 10 keV or less and a second phosphorous implantation at an energy level further lower than that of the arsenic implantation can manufacture the NMOSFET having a suppressed reverse short channel effect and smaller p-n junction leakage current.

Based on the theoretical consideration on the above experiments, the amount of the point defects generated at the time of the arsenic implantation can be largely reduced and the transient enhancement diffusion (TED) of the boron which is a p-type impurity constituting the lo channel region at the time of the heat treatment for the activation can be suppressed by the arsenic implantation of the lower energy level, for example, at 10 keV or less.

Figure 8:
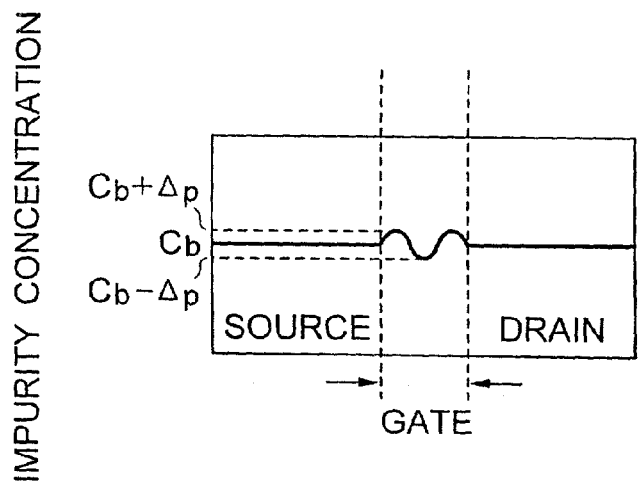
FIG. 8 is a schematic diagram showing distribution of an impurity concentration in a channel region when an arsenic ion is implanted at 10 keV and a phosphorous ion is subsequently implanted at 4 keV.

Thereby, a phenomenon in which impurity concentrations are high at both ends of a channel and low around a central part thereof shown in FIG. 8 can be remarkably moderated. Accordingly, the considerable suppression of the reverse short channel effect is achieved.

The subsequent phosphorous ion implantation secures the distance between the above two interfaces and avoids the increase of the p-n junction leakage current.

Now, the present invention is more specifically described with reference to accompanying drawings.

A semiconductor device of an embodiment is a CMOSFET has a similar configuration to that of a conventional CMOSFET except for a configuration of an NMOSFET constituting a part of the CMOSFET.

Figure 9:
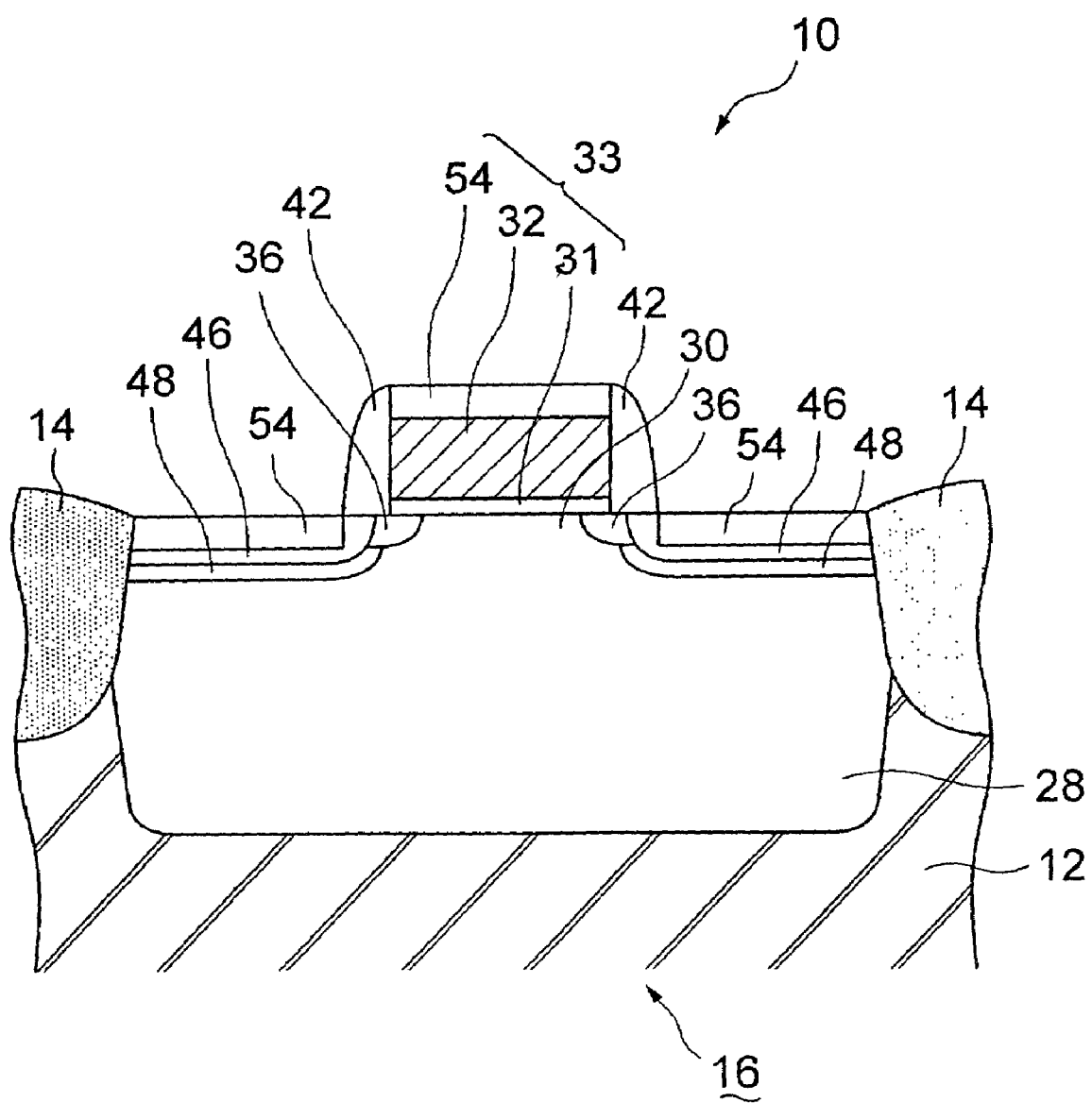
FIG. 9 is a vertical sectional view showing a semiconductor device in accordance with the embodiment of the present invention.

Referring to FIG. 9, the NMOSFET 10 of the present embodiment includes a p-well 28 in a NMOSFET region 16 isolated by element isolation regions 14 of a p-type silicon substrate 12.

In the top part of the p-well 28, a central p-type channel region 30 is formed. Two n-extension regions 36 containing arsenic (As) as n-type impurities are opposed to each other across the p-type channel region 30. Two source/drain main regions 46 containing arsenic as n-type impurities are formed outside of the extension regions 36.

The source/drain main regions 46 having a shallower junction are formed by a low acceleration energy.

Below the extension region 36 and the source/drain main regions 46 and in contact therewith, n-source/drain buffer regions 48 are formed which have a lower phosphorous (P) concentration than an arsenic concentration.

In the present embodiment, the arsenic concentration of the extension region 36 is between $5\times10^{19}/cm^3$ and $2\times10^{20}/cm^3$, the arsenic concentration of the source/drain main region 46 is between $1\times10^{20}/cm^3$ and $5\times10^{21}/cm^3$ and the phosphorous concentration in the source/drain buffer region 48 is between $1\times10^{18}/cm^3$ and $5\times10^{19}/cm^3$.

A gate electrode 33 including a gate oxide film 31, a polysilicon layer 32 and side walls 42 formed thereon and formed by a dielectric film such as SiN is mounted overlying the p-well 28. CoSi layers 54 are formed on the surfaces of the gate electrode 33 and the source/drain main regions 46.

In accordance with the NMOSFET 10 of the present embodiment having the above configuration, the p-n junction leakage current can be reduced by securing the distance between the interfaces by means of using the n-type source/drain region having the shallower junction formed by ion-implanting the arsenic ion at the lower acceleration energy to suppress the reverse short channel effect and by having the buffer region formed by the phosphorous ion implantation.

Accordingly, the p-n junction leakage current of the NMOSFET 10 of the present embodiment under the specified gate voltage becomes smaller. Since the NMOSFET 10 has the smaller reverse short channel effect, the NMOSFET 10 has a larger margin to the gate length and exhibits a specified threshold voltage to elevate the production yield of the NMOSFET.

Referring to FIGS. 10A to 10K, a method for manufacturing the semiconductor device of the above embodiment will be exemplified.

Figure 10A:
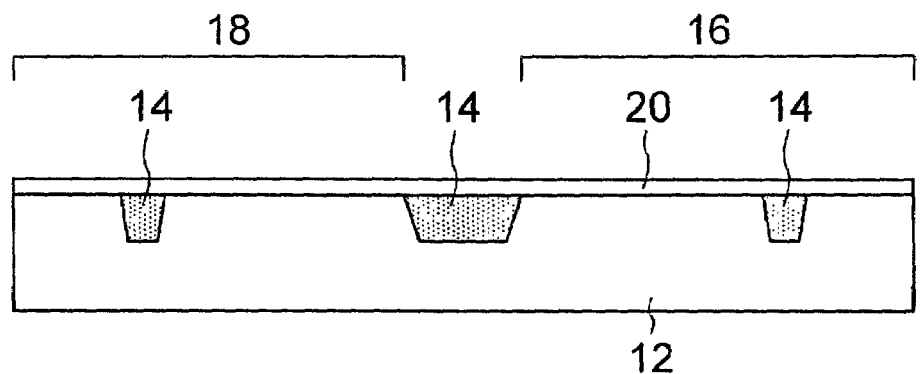
FIGS. 10A to 10K are vertical sectional views showing successive steps for manufacturing the semiconductor device of FIG. 9.

At first, element isolation regions 14 are formed in a p-type silicon substrate 12 by employing a LOCOS process to separate an NMOSFET region 16 from a PMOSFET region 18, and then an oxide film 20 is formed as a protection film on the entire substrate 12 as shown in FIG. 10A.

Figure 10B:
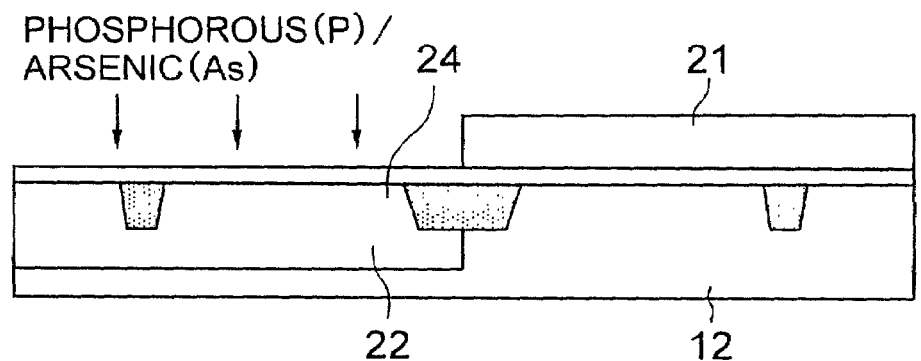

A photoresist film is formed and patterned to provide a mask 21 covering the NMOSFET region 16. Phosphorous is ion-implanted as an n-type impurity into the PMOSFET region 18 to form an n-well 22, and then arsenic is ion-implanted to form an n-channel region 24 as shown in FIG. 10B.

Figure 10C:
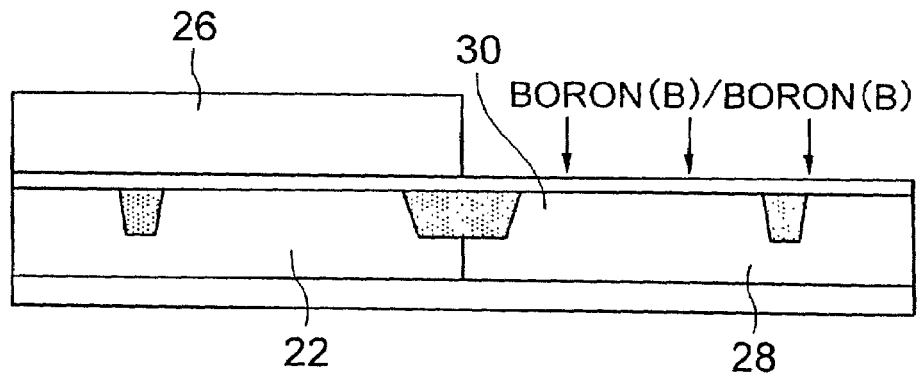

A photoresist film is formed and patterned to provide a mask 26 covering the PMOSFET region 18. Boron is ion-implanted as a p-type impurity into the NMOSFET region 16 to form a p-well 28, and then boron is ion-implanted at an acceleration energy of 30 keV and at a dosage of $1.0\times10^{13}/cm^2$ to form a p-channel region 30 as shown in FIG. 10C.

Figure 10D:
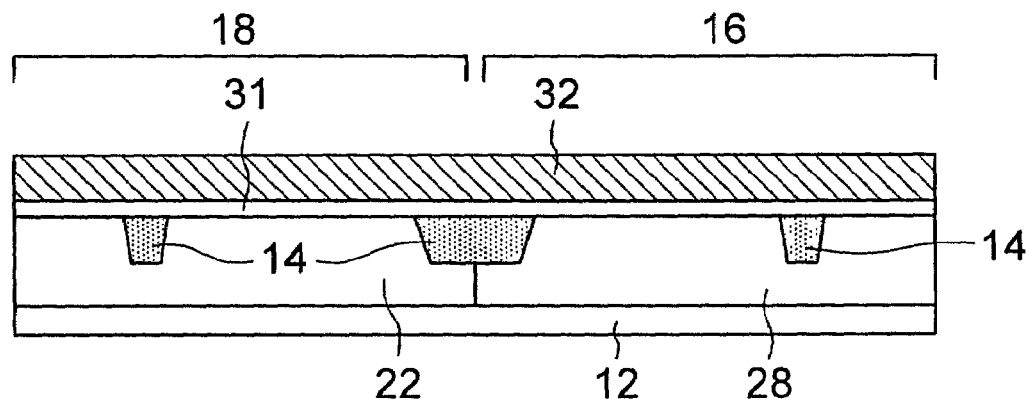
Figure 10E:
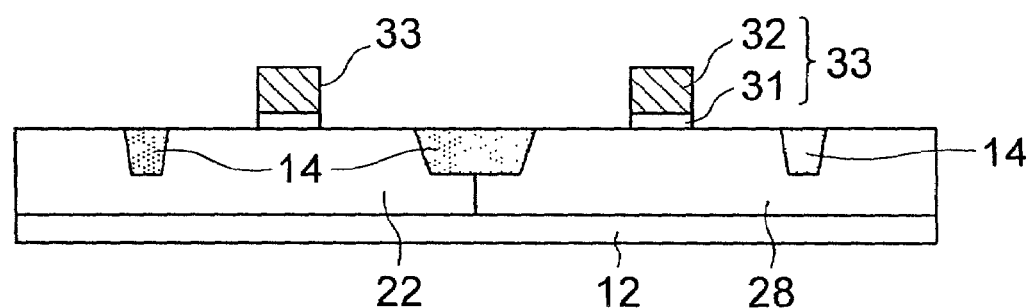

After the oxide film 20 is etched-back, a gate oxide film 31 is formed on the entire substrate and a polysilicon layer 32 is formed on the entire gate oxide film 31 as shown in FIG. 10D. Then, the gate oxide film 31 and the polysilicon layer 32 are patterned to form gate electrodes 33 as shown in FIG. 10E.

Figure 10F:
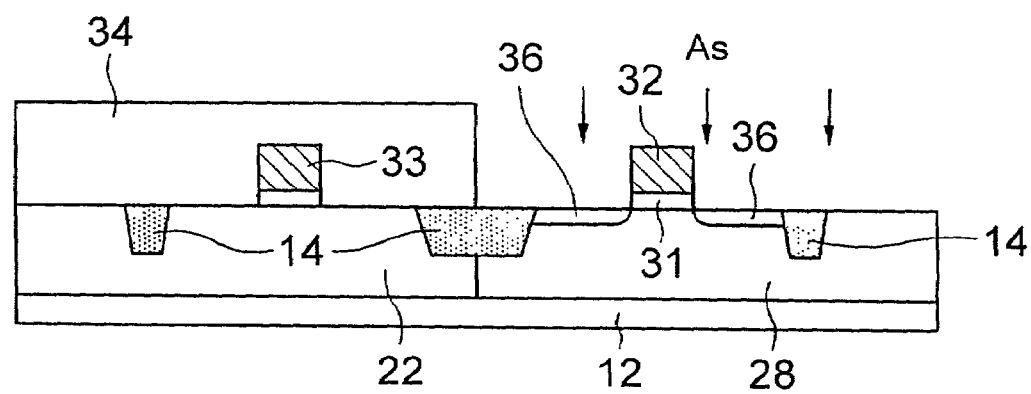

A photoresist film is formed and patterned to provide a mask 34 covering the PMOSFET region 18. Arsenic is ion-implanted as an n-type impurity into the NMOSFET region 16 to form n-extension regions 36 in the top surface of the p-well 28 as shown in FIG. 10F. The wafer is heat-treated by infrared annealing for activation.

Figure 10G:
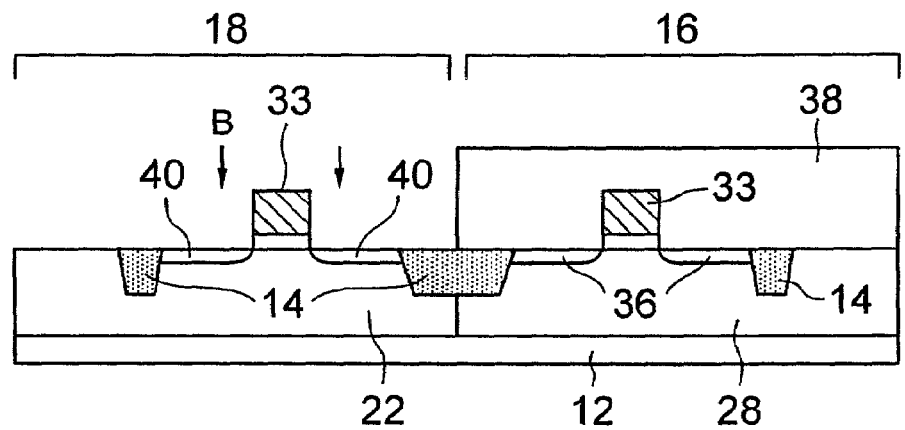

A photoresist film is formed and patterned to provide a mask 38 covering the NMOSFET region 16. Boron is ion-implanted into the PMOSFET region 18 to form n-extension regions 40 in the top surface of the n-well 22 as shown in FIG. 10G.

Figure 10H:
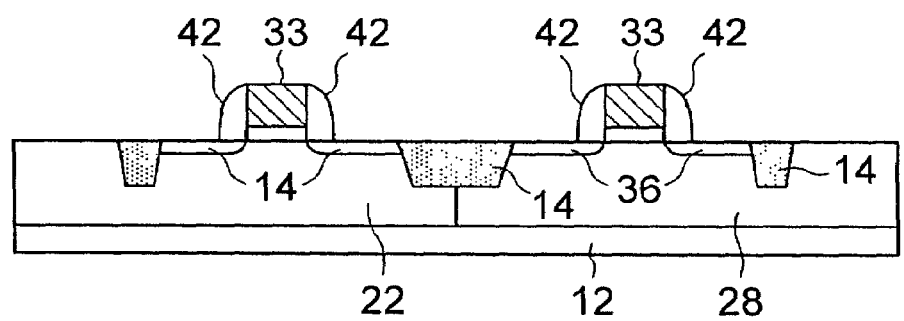
Figure 10:
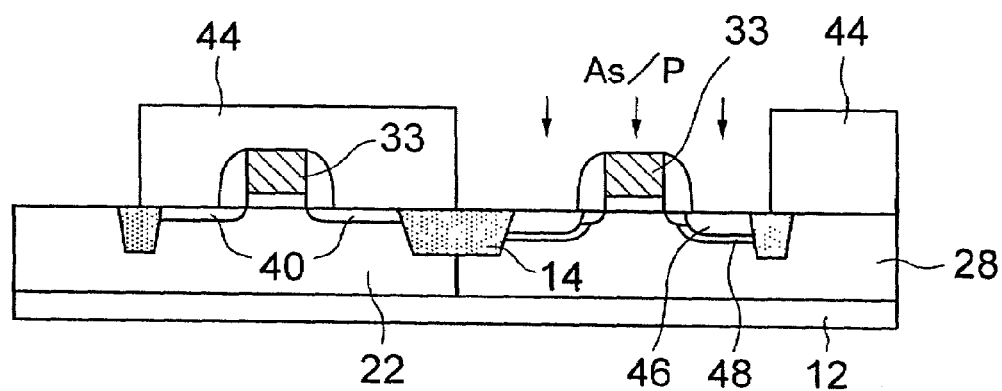

A dielectric film such as a SiN film is grown over the entire substrate and patterned to form side walls 42 on the side surfaces of the gate electrodes 33 as shown in FIG. 10H.

A photoresist film is formed and patterned to provide a mask 44 for exposing only the NMOSFET region 16. Arsenic ion-implantation into the NMOSFET region 16, phosphorous ion-implantation therein and a subsequent heat treatment in accordance with the following conditions form n-source/drain main regions 46 and n-source/drain buffer regions 48 under the n-source/drain main region 46 as shown in FIG. 10I.

| Conditions for Arsenic Ion Implantation | |
|---|---|
| Acceleration energy: | 10 keV |
| Dosage: | $5 \times 10^{15}/cm^2$ |
| Conditions for Phosphorous Ion Implantation | |
| Acceleration energy: | 5 keV |
| Dosage: | $5 \times 10^{14}/cm^2$ |
| Conditions for Heat Treatment | |
| Temperature: | 1000° C. |
| Time: | 10 seconds |

Figure 10J:
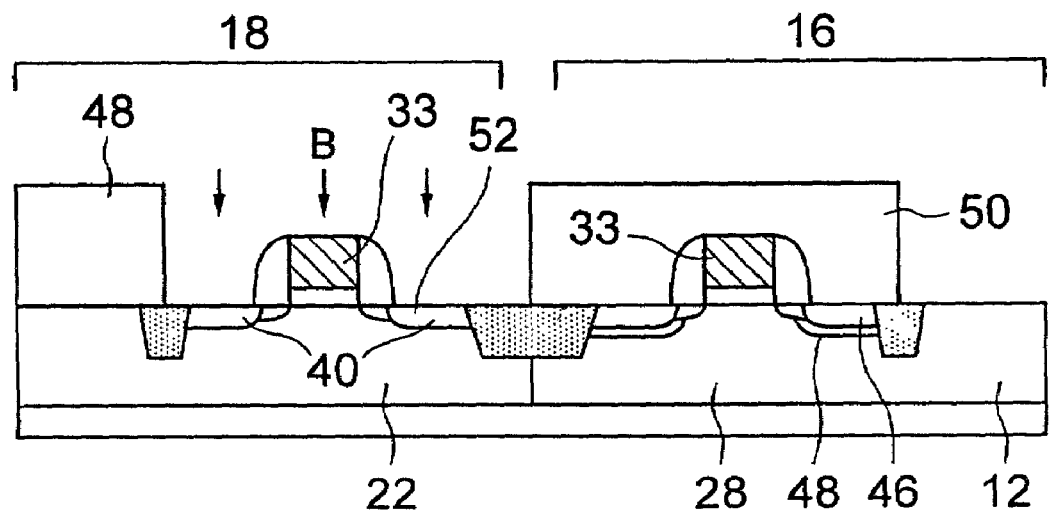

Then, a photoresist film is formed and patterned to provide a mask 50 for exposing only the PMOSFET region 18. Boron is ion-implanted into the PMOSFET region 18 to form p-source/drain regions 52 as shown in FIG. 10J.

Figure 10K:
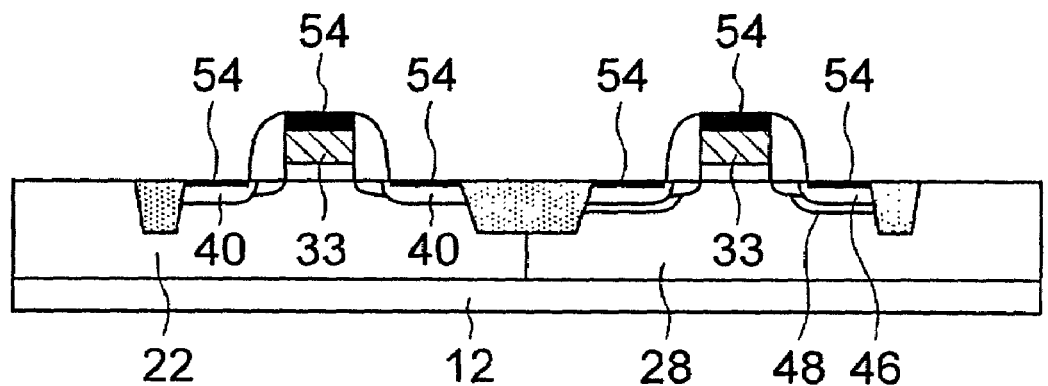

An oxide film is thermally grown on the entire substrate by infrared annealing followed by etching-back and silicification to form $CoSi_2$ layers 54 on the surface layers of the gate electrodes 33, the source/drain regions 46 and 52 as shown in FIG. 10K.

Since the main region 46 having the shallower junction and the buffer region 48 are formed in the NMOSFET region 16 by the two successive ion implantations in the present embodiment, the manufacturing procedures are simple and the manufacturing cost is low.

Since the above embodiments are described only for examples, the present invention is not limited to the above embodiments and various modifications or alternations can be easily made therefrom by those skilled in the art without departing from the scope of the present invention.

What is claimed is:

1. A method for manufacturing a semiconductor device comprising:
    implanting boron ions for forming a channel region to adjust threshold voltage within an NMOSFET forming region divided by an element dividing region;
    implanting two different ions after said implantation of boron, comprising:
        implanting arsenic ions in a semiconductor substrate at a first acceleration energy level which suppresses a reverse short channel effect to form arsenic ion implanted regions thereby forming source/drain regions within said NMOSFET forming region;
        after said implanting said arsenic ions, using a same photoresist mask as a phocoresist mask used in said implanting said arsenic ions, continuously implanting phosphorous ions in the arsenic ion implanted regions, at a second acceleration energy level lower than the first acceleration energy level, so as to form a concentration peak of the phosphorous ions located in the arsenic ion implanted region; and
        performing a heat treatment to activate the arsenic ions and the phosphorous ions in the ion-implanted regions to form source/drain regions and buffer regions, said buffer regions comprising phosphorous ions and extending beyond said source/drain regions, thereby suppressing transient enhancement diffusion (TED) of a boron implanted region; and
    forming an NMOSFET having the source/drain.

2. The method as defined in claim 1, further comprising: implanting n-type impurities in the NMOSFET region to form an n-type extension region before said implanting said two different ions.

3. The method as defined in claim 1, wherein a dosage of the arsenic ion is determined to obtain electrical characteristics required for the NMOSFET and an acceleration energy and a dosage of the phosphorous ion are determined such that an ion-implanted region of the phosphorous ion extends beyond a bottom surface of an ion-implanted region of the arsenic ion.

4. The method as defined in claim 1, wherein the acceleration energy of the arsenic ion is not greater than 15 keV, and the acceleration energy of the phosphorous ion is not greater than 10 keV and is lower than that of the arsenic ion.

5. The method as defined in claim 1, wherein the dosage of the arsenic ion is between $2 \times 10^{15}$ /cm$^2$ and $1 \times 10^{16}$ /cm$^2$, and the dosage of the phosphorous ion is between $5 \times 10^{14}$ /cm$^2$ and $1 \times 10^{15}$ /cm$^2$.

6. The method as defined in claim 1, wherein said first acceleration energy level comprises about 10 keV or less.

7. The method as defined in claim 1, further comprising: implanting boron ions in said semiconductor substrate to form a well region, said arsenic ions being implanted in said well region of said semiconductor substrate.

8. The method as defined in claim 7, wherein said implanting said boron ions for forming said channel region comprises implanting said boron ions in said well region of said semiconductor substrate.

9. The method as defined in claim 8, wherein said implanting boron ions to form said channel region comprises implanting boron ions at 30 key at a dose of $1.0 \times 10^{13}$ /cm$^2$.

10. The method as defined in claim 9, further comprising:
    forming a gate electrode on said channel region;
    implanting arsenic ions in said well region to form extension regions;
    performing a heat treatment to activate said arsenic ions in said well region; and
    after said performing said heat treatment, forming sidewalls on said gate electrode.

11. The method as defined in claim 1, wherein said implanting said phosphorus ions is performed immediately after said implanting said arsenic ions without an intervening step.

12. The method as defined in claim 1, wherein said phosphorus ions and said arsenic ions are implanted in a same surface.

13. The method as defined in claim 1, wherein said buffer regions further comprise arsenic ions, an arsenic ion concentration in said buffer regions being greater than a phosphorus ion concentration in said buffer region.

14. A method for manufacturing a semiconductor device comprising:
    implanting arsenic ions in a semiconductor substrate at a first acceleration energy level to form an arsenic ion implanted region;
    after said implanting said arsenic ions, using a same photoresist mask as a photoresist mask used in said implanting said arsenic ions, implanting phosphorous ions in said arsenic ion implanted region at a second acceleration energy level lower than said first acceleration energy level; and
    performing a heat treatment to activate said arsenic ions and phosphorous ions to form an n-type source/drain main region comprising arsenic and phosphorous ions, and an n-type source/drain buffer region comprising phosphorous ions, said n-type source/drain buffer region extending beyond said n-type source/drain main region,
    wherein said first acceleration energy is no greater tan 15 keV and said second acceleration energy is no greater than 10 keV.

15. The method as defined in claim 14, wherein said device comprises an n-type metal oxide semiconductor field effect transistor (NMOSFET).

16. The method as defined in claim 15, wherein said NMOSFET comprises a gate electrode formed over a channel region, and wherein said n-type source/drain buffer region separates said n-type source/drain main region from said channel region.

17. The method as defined in claim 16, wherein said substrate comprises monocrystalline silicon and said arsenic ion implanted region comprises an amorphous silicon region.

18. The method as defined in claim 17, wherein a p-n junction formed at a first interface between said channel region and said buffer region is separated from a second interface between said amorphous silicon region and said monocrystalline silicon.

19. The method as defined in claim 17, wherein point defects generated by said implanting phosphorous ions are absorbed by said amorphous silicon, such that diffusion of said phosphorous ions during said heat-treating is suppressed.

20. The method as defined in claim 14, wherein said first acceleration energy level comprises about 10 key or less.

21. The method as defined in claim 14, wherein said heat-treating comprises heat treating at about 1000° C. for about 10 seconds.

22. The method as defined in claim 14, wherein an arsenic concentration of said n-type source/drain main region is between $1 \times 10^{20}$ /cm$^3$ and $5 \times 10^{21}$ /cm$^3$ and a phosphorous concentration in said n-type source/drain buffer region is between $1 \times 10^{18}$ /cm$^3$ and $5 \times 10^{19}$ /cm$^3$.

23. A method of manufacturing a semiconductor device, comprising:
    forming extension regions by implanting first arsenic ions in a semiconductor substrate; and
    forming source/drain regions and buffer regions extending beyond said source/drain regions, comprising:
        implanting second arsenic ions in said semiconductor substrate at an acceleration energy level which is no greater than 15 keV to form arsenic ion implanted regions adjacent to said extension regions;
        using a same photoresist mask as a photoresist mask used in said implanting said second arsenic ions, implanting phosphorous ions in said arsenic ion implanted regions at an acceleration energy level which is no greater than 10 keV for implanting said second arsenic ions, so as to form a concentration peak of the phosphorous ions located in the arsenic ion implanted regions; and
    performing a heat treatment to activate said arsenic ions in said arsenic ion implanted regions and said phosphorous ions.

* * * * *